United States Patent [19]

Boynton

[11] 4,127,692
[45] Nov. 28, 1978

[54] JIG FOR MASS SOLDERING SYSTEM

[75] Inventor: Kenneth G. Boynton, Wilton, N.H.

[73] Assignee: Hollis Engineering, Inc., Nashua, N.H.

[21] Appl. No.: 508,052

[22] Filed: Sep. 23, 1974

Related U.S. Application Data

[63] Continuation-in-part of Ser. No. 469,536, May 13, 1974, Pat. No. 3,973,322.

[51] Int. Cl.² .................. H05K 3/30; B23K 31/02
[52] U.S. Cl. ................... 428/137; 428/209;
428/901; 427/96; 427/97; 427/154; 427/290;
228/13; 228/18; 228/37; 228/170; 228/180 R;
228/223; 29/739; 29/741; 29/626; 29/627;
174/68.5; 156/152; 156/155
[58] Field of Search .............. 29/626, 627, 739, 741;
117/6, 201, 168; 174/68.5; 427/96, 97, 154;
228/18, 13, 37, 170, 180 R, 223; 428/137, 209,
DIG. 901; 156/155, 152

[56] References Cited

U.S. PATENT DOCUMENTS

| | | | |
|---|---|---|---|
| 2,983,853 | 5/1961 | Williams | 29/626 |
| 3,005,099 | 11/1962 | Newman | 117/168 |
| 3,117,101 | 1/1964 | Moyer | 117/168 |
| 3,158,927 | 12/1964 | Saunders | 29/626 |
| 3,307,442 | 3/1967 | Imhoff | 174/68.5 |
| 3,350,250 | 10/1967 | Sanz | 29/626 |
| 3,381,081 | 4/1968 | Schalbol | 174/68.5 |
| 3,388,465 | 6/1968 | Johnston | 29/626 |
| 3,538,389 | 11/1970 | Leoesque | 29/626 |
| 3,560,420 | 2/1971 | Tamura | 117/168 |
| 3,655,496 | 4/1972 | Ettre | 174/68.5 |
| 3,693,052 | 9/1972 | Galanti | 174/68.5 |
| 3,704,515 | 12/1972 | Nelson | 29/626 |
| 3,780,431 | 12/1973 | Feeney | 29/626 |

OTHER PUBLICATIONS

Cohen et al., *IBM Tech. Dis. Bulletin*, "Fungus Resistant Protective Coating," vol. 13, No. 2, p. 539, (7-1970).
Troxell, *IBM Tech. Discl. Bull.* "Screenable Epoxy-Anhydride . . . Boards," vol. 7, No. 9, p. 735, (2-1965).

*Primary Examiner*—Michael F. Esposito
*Attorney, Agent, or Firm*—Schiller & Pandiscio

[57] ABSTRACT

A printed circuit board has a coating comprising a selected deformable material which is solder-compatible, and has a melting point below that of solder. Electrical and electronic components are then loaded in position on the board with their leads extending through holes in the board, and imbedded into or through the coating. The coating acts as a jig to steady or stabilize the components in position in the board so that the component leads may then be trimmed to finish length, and the components are then soldered in place. Alternatively the board may be placed in storage for future soldering operation. The coating is melted and displaced simultaneously with soldering. Preferred as coating material are naturally occurring and synthetic waxes having a melting point in the range of about 120°-195° F. In a preferred embodiment of the invention compatible flux active agents are intermixed with the coating material.

43 Claims, 4 Drawing Figures

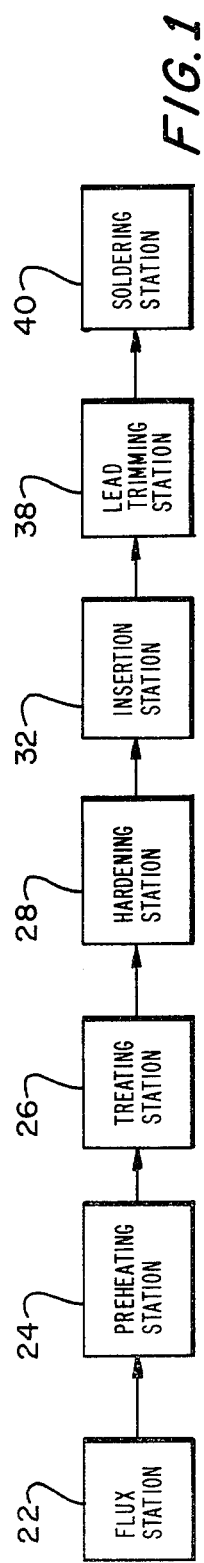
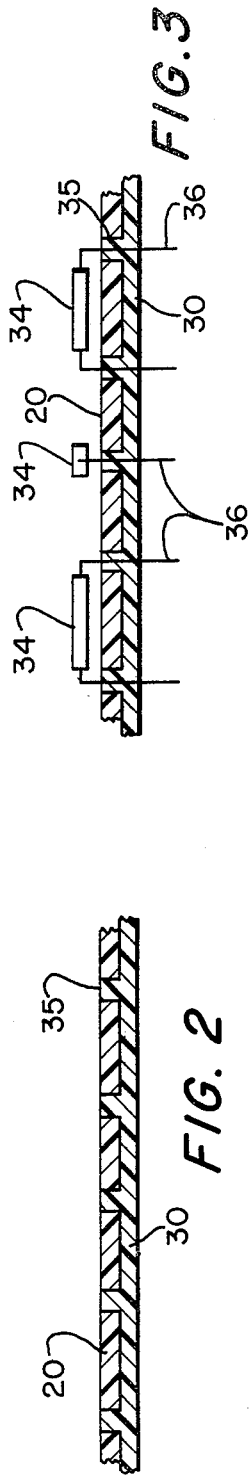
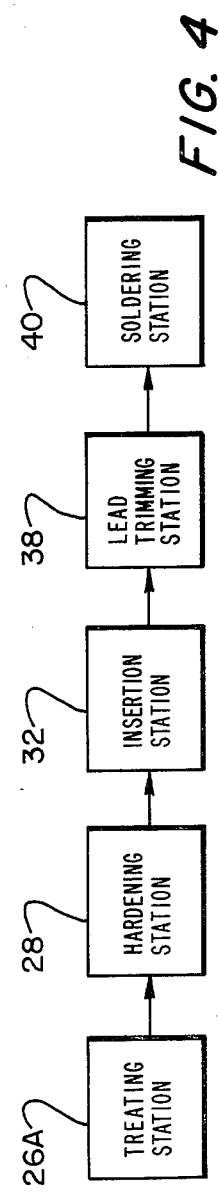

JIG FOR MASS SOLDERING SYSTEM

The present application is a continuation-in-part of my co-pending application Ser. No. 469,536, filed May 13, 1974, now U.S. Pat. No. 3,973,322.

The present invention relates to systems for assembling electrical and electronic components onto substrate circuit boards, and more specifically to systems for mass soldering components onto printed circuit boards.

Numerous processes and apparatus are well known in the art for mounting electrical and electronic components onto printed circuit boards. In general such methods comprise positioning the components onto the boards, soldering the leads of the components to the board, and cutting off the component excess leads.

A typical circuit board assembly may involve a substantial number of components, and to connect each of these components to the board individually with a soldering iron is a tedious process. Accordingly the art has proposed various systems by which a plurality of component connections to a board may be effected in a single or mass soldering operation. One type of mass soldering system involves a so-called "dip soldering" or pot soldering technique. In this type of system, an entire side of the circuit board assembly containing the printed conductors, with the leads from the circuit components projecting through various holes in the board, is briefly immersed or dipped into a body of molten solder, removed and cooled.

Another system involves passing the board through a moving stream of solder, typically in the form of a wave, i.e., a so-called "wave soldering" technique. Various wave soldering techniques form the basis of numerous patents and are described in detail in U.S. Pat. Nos. 2,993,272; 3,004,505; 3,037,274; 3,039,185; 3,056,370; 3,058,441; 3,082,520; 3,100,471; 3,196,829; 3,207,128; 3,216,642; 3,217,959; 3,266,139; 3,277,566 and others. A problem which has plagued both types of soldering systems is the deposition of excess solder in the board in the form of icicling, webbing and bridging. This excess deposition is believed to be caused by the long component leads which may touch or cross each other. Also, due to the length of the component leads it is often necessary to immerse the circuit assembly into a relatively deep solder pot or to utilize a relatively deep wave all of which may result in substantial icicling. However, relatively long component leads are generally desired to facilitate inserting the components onto the board. By the same token, some lead excess length is also generally desired to minimize the possibility that components will be disloged prior to soldering.

Accordingly, the art typically subjects a circuit board to two separate mass soldering operations or steps as follows: The components are first "rough" soldered to stabilize or fix the components position on the board so that the leads could be trimmed to desired length. The soldered connections are then finished in a second soldering step in which excess solder is removed. A typical prior art mass soldering procedure may thus entail the following main steps;

(1) Mount the components loosely onto the circuit board with the component leads extending through holes in the board;
(2) Preclean the component leads and circuit board e.g., as by fluxing;
(3) Solder the clean leads to the circuit board;
(4) Trim the lead excess lengths;
(5) Reflux to clean the cut lead ends exposed in trimming; and
(6) Resolder to remove excess solder from the first soldering step, and to cover the leads exposed after trim.

A principal disadvantage of the prior art as above described is the requirement for the second soldering step which adds appreciably to production costs, and also increases the possibility of damaging heat sensitive components and warping the circuit board.

U.S. Pat. No. 3,568,295 to Moran proposes covering and holding components in position on a board by applying a thin sheet of plastic heat-sealable material over the components. The sheet is drawn down over the components by a vacuum, and the sheet is then heat sealed onto the board. Using this method the components are said to be sufficiently stabilized whereby the excess leads may be trimmed prior to soldering. Obvious disadvantages of this system are the requirement for special equipment for applying and sealing the sheet material, inadvertent destruction of the plastic by heat of soldering and also the need for stripping the sheet from the board after the soldering step is completed. Another disadvantage is the possibility of production of noxious fumes resulting from exposure of the plastic sheet material to molten solder temperatures. A similar process is disclosed in Johnston U.S. Pat. No. 3,388,465.

A principal object of the present invention is therefore to provide an improved apparatus, and method and materials for assembling and mass soldering of circuit boards. Another object is to provide a relatively simple apparatus and method for finish mass soldering of circuit boards in a single soldering step.

A further object is to provide apparatus and process which embodies a new and improved system and means of stabilizing components assembled in a circuit board whereby the component excess leads may be trimmed prior to soldering. Yet other objects will in part appear obvious and will in part appear hereinafter.

The invention accordingly comprises the processes involving the several steps and the relative order of one or more such steps with respect to each other, and the materials, products and apparatus possessing the features, properties and relations of elements which are exemplified in the following detailed disclosure and the scope of the application of which will be indicated in the claims.

In my aforesaid co-pending application Ser. No. 469,536, now U.S. Pat. No. 3,973,322, I disclose a system of assembling and mass soldering electrical and electronic components onto printed circuit boards involving temporarily stabilizing the components mounted on a circuit board with their leads extending through holes in the board, by application thereto of a selected material (or mixture of materials) in liquid state, and hardening the material to form a solid solder-compatible, cement coupling the leads and board. The component leads are then trimmed to finish length, and the leads are then soldered in place in a single mass soldering step utilizing known techniques. The cement is removed by melting simultaneously with the soldering step. A wide range of materials are said to be useful as the cement in accordance with the teachings of my aforesaid application Ser. No. 469,536, now U.S. Pat. No. 3,973,322. In accordance with the present invention a circuit board is first coated at least in part with a selected deformable material which is solder-compatible, and has a melting point below that of solder. The components are then loaded in position in the board with their leads extending through holes in the board, and into or through the coating. Obviously the coating must be somewhat soft or pliable as compared to the component leads so that the leads may imbed into, or penetrate material in their paths. The coating acts as a jig to maintain the desired positional relationship between the board and the components. Lead trimming and soldering is then otherwise as in accordance with my aforesaid application Ser. No. 469,536 now U.S. Pat. No. 3,973,322. A particular advantage of the instant invention is seen in the case where a circuit board is coated with the selected deformable material to which there is added a quantity of a flux active agent. The coating fluxes the board and also acts as an oxygen barrier, whereby continuing oxidation of the circuit pattern during storage may be eliminated or at least substantially reduced. This in turn may reduce many of the problems typically associated with cleaning a badly oxidized circuit board for soldering.

Other advantages will be seen from the following detailed description of the invention. For a fuller understanding of the nature and objects of the present invention, reference should be had to the following detailed description taken in connection with the accompanying drawings wherein like numerals denote like elements, and:

FIG. 1 is a side elevational view, diagrammatically illustrating a soldering system according to the present invention;

FIG. 2 is an enlarged side elevational view, in section, showing a circuit board assembly at a beginning stage in the process of the present invention;

FIG. 3 is an enlarged side-elevational view, in section showing a circuit board assembly at an intermediate stage in the process of the present invention; and FIG. 4 is a side elevational view; diagrammatically illustrating an alternative and preferred soldering system according to the present invention.

In the following detailed description of the present invention, the term "component lead" refers to that part of metallic conductor of an electrical or electronic component that is joined to the printed circuit pattern, i.e., the component leads, terminals, lugs, etc. The term "land" as used herein refers to that part of the metallic pattern on the printed circuit to which the lead is joined. The terms "liquid" and "solid" are used herein with reference to physical properties of materials, and are to be understood as referring to such properties as they exist under conditions as may be specified. For example, the term "solid". Then refers to a state wherein the elements of a matrix or lattice structure of a material exhibit spatial orientation which is substantially static or fixed over ordinary time periods during which the property of solidity is significant or required. The terms "hard", "soft" and "penetrable" then refer to relative physical properties of specified materials as they exist under stated conditions. For example, the metallic leads on an electrical and electronic component may thus be said to be "hard" as compared, for example, to a coating material comprising beeswax. The latter would thus be considered to be "soft" and also "penetrable" with respect to the metallic leads.

The coating material may comprise a non-elastically deformable material such as a crystalline wax, or the material may be resiliently deformable, e.g. an amorphous wax. While there are a large number of materials which can be used as the deformable coating to form the jig in accordance with the technique of the present invention, the preferred materials are relatively soft, normally solid under ambient conditions, which melt or congeal at a temperature in the range of from about 120° to 195° F., and are also thermally stable at the temperature of liquid solder. Among suitable materials may be mentioned naturally occurring waxes such as vegetable waxes, e.g. Euphorbia cerifera (Candelilla), Corzpha cerifera (Carnauba), Stipa Tenacission (Esparto), Syagrus coronata (Ouricury), Rhus succedaneum (Japan wax); animal waxes, e.g. Apis mellifera (Beeswax), Coccus cerifera (Chinese insect wax); petroleum derived mineral waxes, e.g. Ceresine, Ozocerite, Microcrystalline, and Montan waxes. Also a number of synthetic waxes (so-called "Fischer-Tropsch" waxes) are useful in accordance with the technique of the present invention. Additionally, certain polymers and resins such as polyethylene, polybutene, polyindene, dipentene resins, and alkyl resins can be used to achieve the advantages of the instant invention. Of these latter compounds, particularly preferred are the higher molecular weight Carbowax compounds available from Union Carbide Company, New York, N.Y. The manufacturer describes these compounds as comprising polyethylene glycols and methoxypolyethylene glycols. The compounds are available in molecular weights ranging from about 200 to about 20,000. The higher molecular weight compounds of this series normally solid at ambient conditions. Furthermore, such compounds are said to have good thermal stability, and they are completely or at least substantially soluble in water. This later property is particularly advantageous as it permits water clean-up of any residuals on the board. The polymers and resins may be applied either as a hot melt, or in approximate cases, the polymer or resin may be applied as a solution or dispersion in a solvent or carrier, and stabilized or hardened by evaporation of solvent or carrier, or by fusing, all as well known in the art. Alternatively, such polymers and resins may be applied as a liquid monomer, or as a solution or dispersion containing the monomer, and the monomer is then hardened by polymerization, e.g. as by application of heat or ultraviolet light or by treating with a curing agent or polymerization catalyst. Some of these polymers and resins are found to have relatively hard skins when they are fully cured. Thus, to facilitate assembling the components onto the board when such materials are used, it may be necessary or desirable to load the components onto the board before the polymer or resin is fully hardened or cured. Such materials are considered thus to be "soft, penetrable and solder-compatible" for purposes of this invention.

Especially preferred are materials which melt upon exposure of the board to the liquid solder to form a liquid coating upon the body of liquid solder which protects the solder from oxidation, and also may act as a wetting agent to reduce the surface tension of the solder and thus facilitate soldering. It will be understood that materials that evaporate or sublime at the temperature of liquid solder may also be used as the coating in accordance with the technique of the present invention, thus are also intended to be included herein. Obviously, mixtures of compatible waxes, polymers, etc. may also be used in accordance with the teachings of the present invention.

While there are many techniques for applying the deformable material to the circuit board, the preferred method involves treating the board with a moving body of coating material, e.g. as by passing the circuit board through a wave of the material in liquid state, or by spraying. Both of these methods apply the material so that it forms a coating on the board which also at least partially fills the holes in the board. Preferably the material is applied to the board so that it will form a coating on a surface of the board which, when solidified, will have a thickness in the range of about 0.002 to 0.030 inch.

Generally, the board is coated with the material while the latter is in a liquid state, and the coated board is then cooled for a time at a temperature sufficient to solidify the material on the board. For example, where the material is beeswax, the wax is heated to about 155°–160° F. to form the melt; the molten wax is applied to the board; and the board is then cooled to below the liquidus temperature of the wax, e.g. as by forced cool air to solidify the molten wax on the board. Other materials require different hardening operations as will become clear from the description following.

After the liquid material is applied to the board, the components are loaded in position on the board by pushing the leads through the material. The material surrounds the leads for a distance, and thus stabilizes the components, and maintains a desired positional relationship between the board and the components. If desired, the components may be loaded on the board before the coating materials has fully solidified on the board, whereby the material may flow and surround the component leads as the material continues to harden. Alternatively, the components may be loaded in the board after the coating has fully solidified, and, if desired, the loaded board may be heated to melt and to partially reflow the coating material. On the other hand, it is sufficient for many purposes to simply load the components through the hardened material without having to reflow the material, particularly in cases where the material is amorphous. The leads may then be cut to desired (finish) length without displacing the components. After the leads are cut, the components may be soldered in place, or the board with the components may be placed in storage for subsequent soldering. Soldering may be by dip soldering, wave soldering or the like which results in mass soldering of the component leads to circuit lands.

One embodiment of this invention is shown in the FIGS. 1-3 of the drawings. Referring to FIGS. 1 and 2 of the drawings, a printed circuit board 20 is cleaned of unwanted oxides and other films which will otherwise interfere with wetting of the surfaces by the molten solder. This is typically accomplished by treating the surfaces to be soldered with a so-called "flux" at a fluxing station 22. The flux may be any flux well known in the art and may include, for example, a water-white rosin flux, an activated rosin flux or a water soluble flux. Likewise, the flux may be applied to the circuit board and component leads by any manner well known in the art, as for example, by apraying, foaming, brushing, or from a flux wave.

The fluxed board is then passed to a preheating station 24 wherein the board is preheated in a manner well known in the art to mobilize the flux and also drive off the bulk of the flux solvent. The board is typically heated at station 24 to a topside temperature in the range of from about 100°–200° F.

An important feature and critical requirement of the present invention is the ability to temporarily stabilize components in a board so that the component excess leads may be trimmed or cut to finish length prior to soldering. This is accomplished by coating the circuit board at least in part, with a material which acts as a jig.

The material is applied as a liquid at station 26 by any manner well known in the art for applying a liquid, as for example, by spraying or dip coating. Preferably, however, the liquid material is applied from a wave of the material. The liquid material coating on the board is then at least partially hardened at station 28 to form a solid coating 30 on the board (see FIG. 2). The construction of station 28 will be determined by the hardening operation required, which in turn is dependent on the nature of the material. For example, where the material is applied as a melt, station 28 should include means to cool the coated board to solidify the material. Thus station 28 may include a chill box or the like. On the other hand, depending on the nature of the material, the latter's liquidus temperature and the temperature of the ambient air, the material may harden as the board is transported between station 28 and insertion station 32. In such case station 28 will not constitute a separate defined work station. Station 28 may comprise other constructions. For example, where the material is applied as a liquid solution, station 28 should include means for speeding evaporation of the solvent or liquid carrier, e.g. a source of heated air flow. And, where the material is applied as a monomer, station 28 should include means for effecting or accelerating polymerization of the monomer, and may include, for example, a heat source or source of ultra violet light (depending on the nature of the polymerization), or may include means for applying a curing agent or the like to the liquid material coating the board.

Once the material is substantially hardened, the board is passed to insertion station 32 wherein electrical and electronic components 34 are loaded in predetermined positions in holes 35 formed in the board 20. The components may be inserted in the board by any method known in the art which may include manual assembly, semi-automatic, or automatic assembly which may comprise single-station or multiple-station pantagraph or numerically controlled machines all of which are well known in the art and need not be further described. It should be noted that the component leads 36 are sufficiently hard as compared to material 30 so that the leads may penetrate the material without experiencing any substantial resistence. That is to say, the leads may typically be pushed through the material without bending. The material surrounds the leads for a distance, thus stabilizing the components by the leads. The loaded board is then passed to a trimming station 38 wherein the component excess leads are cut to finish length. If desired the board may then be passed to a second flux station (not shown) wherein the cut ends of the component leads may be treated with flux, or the board may be passed directly to the soldering station 40 wherein molten solder is applied to the board and the component leads, and simultaneously the coating is melted and displaced.

An alternative soldering system is shown in FIG. 4. The system of FIG. 4 is similar to that as in FIG. 1, in which, however, a flux compatible with the coating material is admixed with the material and applied to the board simultaneously therewith. The flux may include any of the usual flux active agents, e.g. acidic compounds, known in the art, which are compatible with the selected coating material, and may also include the usual surface tension reducing agents.

While there are a large number of flux agents which can be added to the coating material in accordance with the technique of the present invention, the preferred agents are those which are soluble in or miscible with the material when the latter is in liquid state; however, flux agents which are insoluble in the liquid coating material may also be used in which case means should be provided to agitate the mixture so as to prevent separation of the materials. The coating material acts as a carrier for the flux active agents and also any wetting agent therein so that the usual flux carrier, e.g. alcohol, in the case of a rosin based flux, or water in the case of an aqueous based flux is not generally required.

Various commercially available flux active agents may be mixed with the coating material in accordance with the technique of the present invention, among which may be mentioned various carboxylic acids such as abietic acid, citric acid, lactic acid, oleic acid and pimeric acid; amines, amine carboxylates, and amides, quarternary ammonium salts; inorganic acids such as hydrochloric acid, hydrofluoric acid, orthophosphoric acid; and halogen salts such as zinc chloride. The amount of flux active agents which may be added to the coating material will vary over a wide range depending upon the nature of the flux materials and the strength of flux required. For example, where the flux active agent is oleic acid, and the coating material is candelilla wax, the mixture may typically comprise about 20 volume percent of the acid, the balance the wax, and is suitable for removing thin to moderate films of oxide from copper.

The board and component leads are treated with flux-coating material admixture in one step in a treating station 26A. As in the system of FIG. 1, treating may be by any manner well known in the art for applying a liquid, e.g. as by brushing, spraying, dip coating or from a wave. However, the embodiment shown in FIG. 4 has the added advantage in that it is often possible to eliminate the step of refluxing after the leads are trimmed. This latter advantage is believed due to a flow of flux across the freshly cut leads carried in the coating material as it melts during the soldering step. Additionally, the coating material acts as an oxygen barrier. This allows one to place the coated board in storage after fluxing and the well known problem of oxygen migration generally experienced in cases where a board is pre-fluxed using prior art flux compositions, can thus be eliminated.

Although not shown, it will be understood that wax build-up (FIG. 1) and wax and flux build-up (FIG. 4) in the soldering system may be readily controlled by simply skimming the excess from the top of the liquid solder in station 40.

The following examples illustrate more clearly the manner in which printed circuit boards may be assembled and mass soldered according to the present invention. The invention however should not be construed as limited to the particular embodiments set forth in the examples.

EXAMPLE I

A circuit board assembly is produced as follows: A printed circuit board is fluxed using Kester Flux No. 1544 (manufactured by Kester Division of Litton Industries). The fluxed board is then preheated to a top surface temperature of about 140° F., prior to treating with molten Candelilla wax (refined) by passing the bottom of the board through a wave of the molten wax. The latter is formed in a Hollis Model TDC-12 Wave Soldering device (manufactured by Hollis Engineering, Inc.) which, however, was modified to maintain a sump temperature of only about 170° F., and, the fountain baffles were removed as unnecessary. The board has a residence time of two seconds in the wax wave. The waxed board is cooled under flowing air at ambient temperature whereupon the wax solidifies to form a solid coating on the bottom of the board and in holes 35. The resulting board after cooling below the solidus temperature of the wax appears substantially as shown in FIG. 2 of the drawings. Electrical and electronic components are loaded onto the board by pushing the component leads through the wax filled holes 35. The components are found to be stabilized in position in the board. The component leads are then cut to finish length using a rotary lead cutter, and the board is then re-fluxed. The board is then passed to a soldering station comprising a Hollis Model TDC-12 Wave Soldering device containing a body of molten 63/37 solder (63 wt. percent tin, 37 wt. percent lead) (m.p. 360° F.). The solder wave is approximately 12 inches long, 3 inches wide and about ⅜ inch deep. A layer of soldering oil such as Hollis 225 Soldering Fluid, available from Hollis Engineering, Inc., is floated on top of the solder to protect the solder from oxidation by exposure to the atmosphere, and also acts as a wetting agent to assist soldering by intermixing in the solder wave. The manufacturer describes this oil as comprising a relatively high viscosity mineral oil base stock in major proportion, the remainder a mixture of oxidation inhibitors, mildly acidic fatty acids and wetting agents. Heat from the molten solder melts the wax coating, and the molten solder wets the printed conductors and lands, and displaces the melted wax from the board and leads. The melted wax mixes with and becomes part of the protective coating. A printed circuit board assembly is obtained.

EXAMPLE II

Printed circuit boards are produced as in Example I, in which however, the coating material applied is Carbowax 4000, available from Union Carbide Corporation, New York, NY. The manufacturer describes this material as a polyethylene glycol having a molecular weight of about 3000–3700, apparent specific quantity at 20° C. of 1.204, freezing range of about 53°–56° C., and water solubility at 20° C. of about 62%. The material is heated to about 60° C. A printed circuit board is obtained as in Example I. Residual Carbowax is removed from the board by washing the latter with hot water.

EXAMPLES III–VI

Printed circuit boards are produced as in Example I in which, however, the coating materials are as follows: In each Example the material is applied as a melt.

| EXAMPLE NO. | MATERIAL | MELT TEMPERATURE |
|---|---|---|
| III | Beeswax | 170° F |
| IV | Ozokerite Wax | 180° F |
| V | Microcrystalline Wax | 205° F |
| VI | Chevron Refined Petroleum Wax | 168° F |

Printed circuit board assemblies are obtained as in Example I.

EXAMPLE VII

Printed circuit boards are produced as in Example I in which, however, the two separate fluxing steps are eliminated, and the flux is mixed with the coating material and applied to the board simultaneously with the material. For this Example, the material chosen is Microcrystalline wax to which is added 20 vol. percent of lactic acid. The mixture is agitated constantly in order to maintain the acid in dispersion in the wax. The mixture is heated to 175° F. and applied to the board from a wave as in Example I. A printed circuit board is obtained as in Example I.

EXAMPLES VIII-XI

Printed circuit boards are produced as in Example VII in which, however, the coating material-flux-mixture and melt temperatures are as follows (all percentages by volume):

| Example No. | Material Flux Mixtures | | Melt Temperature |
| --- | --- | --- | --- |
| VIII | Candelilla wax | (80%) | 180° F |
|  | Lactic Acid | (20%) |  |
| IX | Candelilla Wax | (80%) | 165° F |
|  | Oleic Acid | (20%) |  |
| X | Beeswax | (80%) | 155° F |
|  | Oleic Acid | (20%) |  |
| XI | Ozokerite | (80%) | 178° F |
|  | Oleic Acid | (20%) |  |

EXAMPLE XII

The purpose of this example is to show how the coating material also may act as a protective coating to prevent migration of oxygen to the metallic circuit board once the latter has been fluxed. Microcrystalline wax in which there is admixed 50% by volume of oleic acid was selected as the coating material for this study. A number of circuit boards were coated with the wax-acid mixture. The coating solidified and the coated boards were put in shelf storage, exposed to the atmosphere for the following times:

2 weeks
4 weeks
6 weeks
8 weeks
12 weeks

The coated boards were removed from storage, components were loaded on the board, the loaded board was preheated prior to soldering to reflow the wax, the component leads were then cut and the components were then soldered to the board in a wave soldering device as in Example I.

Results:

All the boards are quite solderable without having to be refluxed. Some of the boards stored for the longest period of time were found to be slightly more solderable, believed due to some low level fluxing taking place under continued storage. Uncoated boards as controls were prepared as follows: The boards were fluxed by immersing for ten seconds in an aqueous solution of nitric acid (70.1%); the boards were then washed in water, and dried. The boards were quite solderable immediately after this treatment. On the other hand, after storage for just one week, the uncoated boards could not be satisfactorily soldered.

The coating thus appears to act as an oxygen barrier.

Certain changes will be obviuos to one skilled in the art and may be made in the above disclosure without departing from the scope of the invention herein involved. For example, instead of applying the coating to the circuit-carrying side of the board, the coating can be applied to the opposite side (top surface) of the board. It will be appreciated that with this technique much of the material may remain on the top surface of the board and not be melted or displaced during soldering. This procedure may have particular application in the case where it is desired to provide environmental protection to the circuit assembly. Still other changes will be obvious to one skilled in the art. For example, where no mass lead trimming equipment is available, it may be desired to trim the component leads to finish length prior to inserting the components in position on the board. In such case it may also be desired to heat the board after the components have been inserted in position on the board so as to partially melt or reflow the material, and the board is then cooled whereby the melted material may resolidify more closely around the short component leads and thus better stabilize the components. On the other hand, stabilization problems may not be as severe in the case where the component leads are trimmed prior to loading on the board, and thus reflow may not be required. Accordingly, it is intended that all matter contained in the above description or shown in the accompanying drawings shall be interpreted in an illustrative and not in a limiting sense.

What is claimed is:

1. A method of treating a perforated circuit board in preparation for mass joining with solder electrical and electronic components by their leads to said board, said board having adjacent at least some of its perforations a metallic pattern to which the component leads can be joined by said solder, said method comprising applying to said board so as to at least partially cover (i) at least some of said perforations and (ii) said metallic pattern, a material which acts as a jig to stabilize said components in position relative to said board, said material being applied in liquid state, said material in solid form being substantially deformable, compatible with said solder and having a melting point below that of said solder, and at least hardening the material covering said perforations and said metallic pattern whereby to form a meltable, deformable coating compatible with said solder, and forcing said leads into said perforations for a distance sufficient to penetrate the said material covering said perforations so that said material supports said leads relative to said board.

2. A method according to claim 1 wherein said components are loaded into said coating after said liquid material is at least partially hardened.

3. A method according to claim 1 wherein said material is in the form of a melt, and said melt is hardened by cooling to below its liquidus temperature.

4. A method according to claim 1 further including the step of applying a flux to said board prior to treating with said material.

5. A method according to claim 1 wherein said coating comprises a resiliently deformable material.

6. A method according to claim 1 wherein said coating comprises a non-elastically deformable material.

7. A method of mass joining with solder electrical and electronic components assembled in a perforated circuit board, said board having adjacent at least some of its perforations a metallic pattern with which the component leads can be joined by said solder and wherein the component leads extend through at least some of the perforations in said board and excess lengths of said component leads are trimmed prior to soldering, said method comprising the steps in sequence of:
  (a) forming on said board so as to cover at least in part (i) at least some of said perforations and (ii) said metallic pattern, a coating of a stabilizer material which (1) is compatible with said solder when said solder is in a molten state, (2) has a melting point below that of said solder; and (3) is physically deformable by said leads;
  (b) loading said components in position on said board by forcing said leads into said perforations for a distance sufficient for said leads to penetrate the material covering said perforations so that said material acts as a jig to support said leads relative to said board;
  (c) trimming said leads;
  (d) immersing said boards and trimmed leads at least in part in a molten body of solder so as substantially simultaneously to cause said material to melt and said solder to replace the melted material on said metallic portions on said board and to wet said metallic portions on said board and leads.

8. A method according to claim 7 wherein said solder-compatible, deformable material comprises an amorphous material.

9. A method according to claim 7 wherein said solder-compatible, deformable material comprises crystalline material.

10. A method according to claim 7 wherein said solder-compatible, deformable material has a melting point temperature in the range of about 120°–195° F.

11. A method according to claim 7 wherein said solder-compatible, deformable material is selected from the group consisting of waxes, resins and polymers.

12. A method according to claim 11 wherein said material comprises a naturally occuring wax.

13. A method according to claim 11 wherein said naturally occuring wax comprises a vegetable wax.

14. A method according to claim 11 wherein said naturally occuring wax comprises an animal wax.

15. A method according to claim 11 wherein said naturally occuring wax comprises a petroleum derived mineral wax.

16. A method according to claim 11 wherein said material comprises a synthetic wax derived from a Fischer-Tropsch synthesis.

17. A method according to claim 11 wherein said material comprises a resin selected from the group consisting of alkyl resins and dipentene resins.

18. A method according to claim 11 wherein said polymer is selected from the group consisting of polyethylene, polybutene, polyindene and polyethylene glycol.

19. A method according to claim 11 wherein said material comprises a water soluble polymer.

20. A method according to claim 7 wherein said coating comprises a resiliently deformable material.

21. A method according to claim 7 wherein said coating comprises a non-elastically deformable material.

22. Method according to claim 5 wherein said solder-compatible, deformable material is applied to said circuit board as a selected liquid material, and including the step of at least partially hardening said liquid.

23. A method according to claim 5 including the step of applying a flux to said circuit board and leads.

24. A method according to claim 19 wherein said flux is applied prior to the application of said liquid material.

25. A method according to claim 19 wherein said flux is applied simultaneously with the application of said liquid material.

26. A method according to claim 7 including the steps of heating said coating after the components are loaded in position so as to at least partially melt the said coating and then cooling said melted coating so as to resolidify said melted coating onto said leads and said metallic pattern.

27. A system for joining with solder, a perforated circuit board, said board having a metallic pattern adjacent at least some of its perforations, and electrical and electronic components assembled in said circuit board wherein the component leads extend through at least some of said perforations in said board and can be soldered to said metallic pattern, and comprising in combination means for applying to said board so as to at least partially cover (i) at least some of said perforations and (ii) said metallic pattern, a coating of a selected material which is (1) deformable, (2) compatible with molten solder when said solder is in a molten state and (3) has a melting point below that of said solder; means for positioning said components on said board and for forcing said leads into said perforations so as to penetrate the said material covering said perforations whereby said material acts as a jig to support said leads relative to said board; means for trimming said leads to a predetermined length; and means adapted to contain a body of said solder in molten state and for applying said molten solder to said board and trimmed leads so as to cause said material to melt and to substantially simultaneously replace the melted material in said perforations with molten solder.

28. A system according to claim 27 wherein said means for applying said material comprises a container adapted for maintaining a body of said material in liquid state.

29. A system according to claim 27 wherein said container includes means for heating said material so as to maintain said material in molten condition.

30. A system according to claim 29 including means for forming said liquid as a moving body.

31. A system according to claim 29 further including means for at least partially hardening said material after the latter is applied to said board.

32. A system according to claim 31 wherein said means for hardening comprises cooling means.

33. A system according to claim 31 wherein said means for hardening comprises heating means.

34. A system according to claim 31 wherein said means for hardening comprises means for treating said material with a chemical hardening agent.

35. A system according to claim 31 wherein said means for hardening comprises means for exposing said material to ultra-violet light.

36. A system according to claim 27 further including means for applying a flux to said board.

37. A system according to claim 27 wherein said means for applying said material is adapted to simultaneously apply said flux.

38. An article of manufacture comprising a circuit board having a plurality of perforations and a metallic pattern adjacent at least some of said perforations to which component leads can be mounted to said board by solder, said board having a deformable coating which is adapted to act as a jig to stabilize components in position relative to said board, said coating at least partially covering (i) at least some of said perforations and (ii) said metallic pattern, said coating (a) being normally solid under ambient conditions, (b) having a melting point below that of said solder and (c) being compatible with said solder when said solder is in a molten state.

39. An article of manufacture according to claim 38 wherein said coating also includes a flux.

40. An article of manufacture according to claim 38 wherein said coating comprises a resiliently deformable material.

41. An article of manufacture according to claim 38 wherein said coating comprises a non-elastically deformable material.

42. A method of treating a circuit board having a plurality of perforations and a metallic pattern adjacent at least some of said perforations to which component leads can be mounted to said board by solder, so as to preserve said metallic pattern from oxidation, said method comprising coating said metallic pattern at least in part with a deformable material, said material (a) being normally solid under ambient conditions, (b) having a melting point below that of said solder, and (c) being compatible with said solder when said solder is in a molten state.

43. A method according to claim 42 including the step of admixing a flux with said material, and applying the resulting mixture to said board.

UNITED STATES PATENT AND TRADEMARK OFFICE
CERTIFICATE OF CORRECTION

PATENT NO. : 4127692

DATED : November 28, 1978

INVENTOR(S) : Kenneth G. Boynton

It is certified that error appears in the above—identified patent and that said Letters Patent are hereby corrected as shown below:

Claim 1, column 10, line 45, the term "partially" should be inserted after "at least".

Signed and Sealed this

Twenty-ninth Day of May 1979

[SEAL]

Attest:

RUTH C. MASON
Attesting Officer

DONALD W. BANNER
Commissioner of Patents and Trademarks